(12) United States Patent
Pierrat

(10) Patent No.: US 7,659,042 B2
(45) Date of Patent: Feb. 9, 2010

(54) FULL PHASE SHIFTING MASK IN DAMASCENE PROCESS

(75) Inventor: Christophe Pierrat, Santa Clara, CA (US)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 12/184,215

(22) Filed: Jul. 31, 2008

(65) Prior Publication Data

US 2008/0286664 A1 Nov. 20, 2008

Related U.S. Application Data

(63) Continuation of application No. 11/035,788, filed on Jan. 13, 2005, and a continuation of application No. 10/295,575, filed on Nov. 14, 2002, now Pat. No. 6,866,971, and a continuation-in-part of application No. 09/932,239, filed on Aug. 17, 2001, now Pat. No. 7,083,879, and a continuation-in-part of application No. 09/669,368, filed on Sep. 26, 2000, now Pat. No. 6,524,752.

(60) Provisional application No. 60/363,674, filed on Mar. 11, 2002.

(51) Int. Cl.
*G03F 1/02* (2006.01)
(52) U.S. Cl. .................. 430/5; 716/19; 716/21
(58) Field of Classification Search ............ 430/5, 430/313, 311, 394; 716/19, 21
See application file for complete search history.

(56) References Cited

U.S. PATENT DOCUMENTS 5,298,365 A 3/1994 Okamoto et al.

(Continued)

FOREIGN PATENT DOCUMENTS

DE 195 45 163 A1 6/1996

(Continued)

OTHER PUBLICATIONS

Ackmann, P., et al., "Phase Shifting and Optical Proximity Corrections to Improve CD Control on Logic Devices in Manufacturing for Sub 0.35 um I-Line", SPIE, vol. 3051, pp. 146-153, Mar. 12-14, 1997.

(Continued)

*Primary Examiner*—Mark F Huff
*Assistant Examiner*—Rashid Alam
(74) *Attorney, Agent, or Firm*—Bever, Hoffman & Harms, LLP; Jeanette S. Harms

(57) ABSTRACT

A full phase shifting mask (FPSM) can be advantageously used in a damascene process for hard-to-etch metal layers. Because the FPSM can be used with a positive photoresist, features on an original layout can be replaced with shifters on a FPSM layout. Adjacent shifters should be of opposite phase, e.g. 0 and 180 degrees. In one embodiment, a dark field trim mask can be used with the FPSM. The trim mask can include cuts that correspond to cuts on the FPSM. Cuts on the FPSM can be made to resolve phase conflicts between proximate shifters. In one case, exposing two proximate shifters on the FPSM and a corresponding cut on the trim mask can form a feature in the metal layer. The FPSM and/or the trim mask can include proximity corrections to further improve printing resolution.

19 Claims, 7 Drawing Sheets

U.S. PATENT DOCUMENTS

| | | | |
|---|---|---|---|
| 5,302,477 A | 4/1994 | Dao et al. | 430/5 |
| 5,308,741 A | 5/1994 | Kemp | 430/312 |
| 5,324,600 A | 6/1994 | Jinbo et al. | 430/5 |
| 5,364,716 A | 11/1994 | Nakagawa et al. | 430/5 |
| 5,472,814 A | 12/1995 | Lin | 430/5 |
| 5,523,186 A | 6/1996 | Lin et al. | 430/5 |
| 5,527,645 A | 6/1996 | Pati et al. | 430/5 |
| 5,537,648 A | 7/1996 | Liebmann et al. | 395/500 |
| 5,538,815 A | 7/1996 | Oi et al. | 430/5 |
| 5,565,286 A | 10/1996 | Lin | 430/5 |
| 5,573,890 A | 11/1996 | Spence | 430/311 |
| 5,595,843 A | 1/1997 | Dao | 430/5 |
| 5,620,816 A | 4/1997 | Dao | 430/5 |
| 5,629,113 A * | 5/1997 | Watanabe | 430/5 |
| 5,631,110 A | 5/1997 | Shioiri et al. | |
| 5,635,316 A | 6/1997 | Dao | 430/5 |
| 5,636,131 A | 6/1997 | Liebmann et al. | 364/490 |
| 5,702,848 A * | 12/1997 | Spence | 430/5 |
| 5,761,075 A | 6/1998 | Oi et al. | 364/488 |
| 5,766,804 A | 6/1998 | Spence | 430/5 |
| 5,766,806 A | 6/1998 | Spence | 430/5 |
| 5,807,649 A * | 9/1998 | Liebmann et al. | 430/5 |
| 5,858,580 A | 1/1999 | Wang et al. | 430/5 |
| 5,923,562 A * | 7/1999 | Liebmann et al. | 716/19 |
| 5,923,566 A | 7/1999 | Galan et al. | 364/489 |
| 5,994,002 A | 11/1999 | Matsuoka | 430/5 |
| 5,998,068 A | 12/1999 | Matsuoka | 430/5 |
| 6,013,397 A | 1/2000 | Lin et al. | |
| 6,057,063 A | 5/2000 | Liebmann et al. | 430/5 |
| 6,066,180 A | 5/2000 | Kim et al. | 716/19 |
| 6,083,275 A | 7/2000 | Heng et al. | 716/19 |
| 6,130,012 A | 10/2000 | May et al. | 430/5 |
| 6,139,994 A | 10/2000 | Broeke et al. | 430/5 |
| 6,185,727 B1 | 2/2001 | Liebmann | 716/19 |
| 6,228,539 B1 | 5/2001 | Wang et al. | 430/5 |
| 6,251,549 B1 | 6/2001 | Levenson | 430/11 |
| 6,258,493 B1 | 7/2001 | Wang et al. | 430/5 |
| 6,335,128 B1 | 1/2002 | Cobb et al. | 430/5 |
| 6,338,922 B1 | 1/2002 | Liebmann et al. | 430/5 |
| 6,420,074 B2 | 7/2002 | Wang et al. | 430/5 |
| 6,436,590 B2 | 8/2002 | Wang et al. | 430/5 |
| 6,518,180 B1 | 2/2003 | Fukuda | |
| 6,660,462 B1 * | 12/2003 | Fukuda | 430/394 |
| 6,866,971 B2 | 3/2005 | Pierrat | |
| 2001/0000240 A1 | 4/2001 | Wang et al. | 430/5 |
| 2001/0028985 A1 | 10/2001 | Wang et al. | 430/5 |
| 2002/0024139 A1 | 2/2002 | Chan et al. | |
| 2002/0083410 A1 | 6/2002 | Wu et al. | 716/19 |
| 2002/0122994 A1 | 9/2002 | Cote et al. | 430/5 |
| 2002/0127479 A1 | 9/2002 | Pierrat | 430/5 |
| 2002/0129327 A1 | 9/2002 | Pierrat et al. | 716/19 |
| 2002/0136964 A1 | 9/2002 | Pierrat | 430/5 |
| 2002/0142231 A1 | 10/2002 | Kling et al. | 430/5 |
| 2002/0142232 A1 | 10/2002 | Kling et al. | 430/5 |
| 2002/0144232 A1 | 10/2002 | Ma et al. | 716/21 |
| 2002/0152454 A1 | 10/2002 | Cote et al. | 716/21 |
| 2002/0155363 A1 | 10/2002 | Cote et al. | 430/5 |

FOREIGN PATENT DOCUMENTS

| | | |
|---|---|---|
| EP | 0 653 679 A2 | 5/1995 |
| GB | 2333613 A | 7/1999 |
| JP | 62067547 | 3/1987 |
| JP | 2-140743 | 5/1990 |
| JP | 1283925 | 2/1991 |
| JP | 6-67403 | 3/1994 |
| JP | 8051068 | 2/1996 |
| JP | 8-236317 | 9/1996 |
| JP | 2638561 | 4/1997 |
| JP | 2650962 | 5/1997 |
| JP | 10-133356 | 5/1998 |
| JP | 11-143085 | 5/1999 |
| WO | WO 98/12605 A1 | 3/1998 |
| WO | WO 00/25181 A | 5/2000 |
| WO | WO 01/23961 A1 | 4/2001 |
| WO | WO 02/03140 A1 | 1/2002 |
| WO | WO 02/073312 A1 | 9/2002 |

OTHER PUBLICATIONS

Matsuoka, K., et al., "Application of Alternating Phase-Shifting Mask to 0.16um CMOS Logic Gate Patterns", Matsushita Electric Ind. Co., Ltd. (9 pages).

Wang, R., et al., "Polarized Phase Shift Mask: Concept, Design, and Potential Advantages to Photolithography Process and Physical Design", Motorola Semiconductor Product Sector (12 pages).

Ogawa, K., et al., "Phase Defect Inspection by Differential Interference", Lasertec Corporation (12 pages).

Pistor, T., "Rigorous 3D Simulation of Phase Defects in Alternating Phase-Shifting Masks", Panoramic Technology Inc. (13 pages).

Semmier, A., et al., "Application of 3D EMF Simulation for Development and Optimization of Alternating Phase Shifting Masks", Infineon Technologies AG (12 pages).

Wong, A., et al., "Polarization Effects in Mask Transmission", University of California Berkeley (8 pages).

Erdmann, A., "Topography Effects and Wave Aberrations in Advanced PSM-Technology", Fraunhofer Institute of Integrated Circuits (11 pages).

Granik, Y., et al., "CD Variation Analysis Technique and its Application to the Study of PSM Mask Misalignment", Mentor Graphics (9 pages).

Hanyu, et al., "New Phase-Shifting Mask with Highly Transparent SiO2 Phase Shifters", Fujitsu Laboratories Ltd. (11 pages).

Ishiwata, N., et al., "Fabrication of Phase-Shifting Mask", Fujitsu Limited (11 pages).

Levenson, M., at al., "Phase Phirst! An Improved Strong-PSM Paradigm", M.D. Levenson Consulting, Petersen Advanced Lithography, KLA-Tencor (10 pages).

Levenson, M., et al., "SCAA Mask Exposures and Phase Phirst Design for 110nm and Below", M.D. Levenson Consulting, Canon USA, Inc., JSR Microelectronics, Inc. (10 pages).

Lin, B.J., "The Relative Importance of the Building Blocks for 193nm Optical Lithography", Linnovation, Inc. (12 pages).

McCallum, M., et al., "Alternating PSM Mask Performance—a Study of Multiple Fabrication Technique Results", International SEMATECH (6 pages).

Morikawa, Y., et al., "100nm-alt.PSM Structure Discussion for ArF Lithography", Dai-Nippon Printing Co., Ltd. (15 pages).

Ozaki, T., et al., "A 0.15um KrF Lithography for 1Gb DRAM Product Using Highly Printable Patterns and Thin Resist Process", Toshiba Corporation (2 pages).

Rhyins, P., et al., "Characterization of Quartz Etched PSM Masks for KrF Lithography at the 100nm Node", Photronics, Inc., MIT Lincoln Lab, Arch Chemicals, Finle Technologies, KLATencor Corp. (10 pages).

Rosenbluth, A., et al., "Optimum Mask and Source Patterns to Print a Given Shape", IBM (17 pages).

Schmidt, R., et al., "Impact of Coma on CD Control for Multiphase PSM Designs", AMD, ASML (10 pages).

Sewell, H., et al., "An Evaluation of the Dual Exposure Technique", SVG Lithography Systems Inc. (11 pages).

Spence, C., et al., "Optimization of Phase-Shift Mask Designs Including Defocus Effects", AMD, Princeton University, Vecor Technologies Inc. (8 pages).

Suzuki, A., et al., "Multilevel Imaging System Realizing k1=−.3 Lithogrpahy", Canon Inc. (13 pages).

Vandenberghe, G., et al., "(Sub-)100nm Gate Patterning Using 248nm Alternating PSM", IMEC, Mentor Graphics (9 pages).

Fritze, M., et al., "100-nm Node Lithography with KrF?", MIT Lincoln Lab, Numberical Technologies, Photronics, Arch Chemicals (14 pages).

Fukuda, H., et al., "Patterning of Random Interconnect Using Double Exposure of Strong-Type PSMs", Hitachi Central Research Lab (8 pages). J. Vac. Sci. Technol. B. (17(6), Nov./Dec. 1999, p. 3291-3295.

Ferguson, R., et al., "Pattern-Dependent Correction of Mask Topography Effects for Alternating Phase-Shifting Masks", IBM Microelectronics, University of California Berkeley (12 pages).

Toublan, O., et al.. "Phase and Transmission Errors Aware OPC Solution for PSM: Feasibility Demonstration", Mentor Graphics Corp. (7 pages).

Yanagishita, Y., et al., "Phase-Shifting Photolithography Applicable to Real IC Patterns", Fujitsu Limited (11 pages).

Levenson, M., et al., "Improving Resolution in Photolithography with a Phase-Shifting Mask", IEEE, Transactions On Electron Devices, vol. ED-29, No. 12, pp. 1828-1836, Dec. 1982.

Levenson, M., et al., "The Phase-Shifting Mask II: Imaging Simulations and Submicrometer Resist Exposures", IEEE Transactions on Electron Devices, vol. ED-31, No. 6, pp. 753-763, Jun. 1984.

Terasawa, T., et al., "0.3-Micron Optical Lithography Using a Phase-Shifting Mask", SPIE, Optical/Laser Microlithography II, vol. 1088, pp. 25-33, Mar. 1989.

Nitayama, A., et al., "New Phase Shifting Mask with Self-Aligned Phase Sifters for a Quarter Micron Photolithography", IEDM, pp. 3.3.1-3.3.4, Dec. 3-6, 1989.

Jinbo, H., et al., "0.2um or Less i-Line Lithography by Phase-Shifting-Mask Technology", IEEE, pp. 33.3.1-33.3.4 (1990).

Neureuther, A., "Modeling Phase Shifting Masks", SPIE, 10th Annual Symposium On Microlithography, vol. 1496, pp. 80-85 (1990).

Yamanaka, T., et al., "A 5.9um2 Super Low Power SRAM Cell Using a New Phase-Shift Lithography", IEDM, pp. 18.3.1-18.3.4 (1990).

Inokuchi, K., et al., "Sub-Quarter Micron Gate Fabrication Process Using Phase-Shifting-Mask for Microwave GaAs Devices", Extended Abstracts Of The 1991 Intl. Conference On Solid State Devices And Materials, Yokohama, Japan, pp. 92-94 (1991).

Inokuchi, K., et al., "Sub-Quarter-Micron Gate Fabrication Process Using Phase-Shifting Mask for Microwave GaAs Devices", Japanese Journal Of Applied Physics, vol. 30, No. 12B, pp. 3818-3821, Dec. 1991.

Jinbo, H., et al., "Improvement of Phase-Shifter Edge Line Mask Method", Japanese Journal Of Applied Physics, vol. 30, No. 11B, pp. 2998-3003, Nov. 1991.

Kimura, T., et al., "Subhalf-Micron Gate GaAs Mesfet Process Using Phase-Shifting-Mask Technology", IEEE, GaAs IC Symposium, pp. 281-284 (1991).

Wiley, J., et al., "Phase Shift Mask Pattern Accuracy Requirements and Inspection Technology", SPIE, Integrated Circuit Metrology, Inspection, And Process Control V, vol. 1464, pp. 346-355 (1991).

Hirai, Y., et al., "Automatic Pattern Generation System for Phase Shfiting Mask", 1991 Symposium on VLSI Technology, Digest of Technical Papers, pp. 95-96, May 28-30, 1991.

Wong, A., et al., "Investigating Phase-Shifting Mask Layout Issues Using a Cad Toolkit", IEEE, pp. 27.4.1-27.4.4 (1991).

Terasawa, T., et al., "Imaging Characteristics of Multi-Phase-Shifting and Halftone Phase-Shifting Masks", Japanese Journal of Applied Physics, vol. 30, No. 11B, pp. 2991-2997, Nov. 1991.

Burggraaf, P., "Four More Significant Japanese Advances in Phase Shfiting Technology", Semiconductor International, p. 16, Dec. 1991.

Kemp, K., et al., "Optimized Phase Shift Mask Designs for Real Devices", KTI Microlithography Seminar, pp. 67-75, Oct. 14-15, 1991.

Newmark, D., et al., "Phase-Shifting Mask Design Tool", SPIE—11th Annual BACUS Symposium on Photmask Technology, vol. 1604, pp. 226-235, Sep. 25-27, 1991.

Nolscher, C., et al., "Investigation of Self-Aligned Phase-Shifting Reticles by Simulation Techniques", SPIE—Optical/Laser Microlithography IV, vol. 1463, pp. 135-150 (1991).

Inoue, S., et al., "Simulation Study on Phase-Shifting Masks for Isolated Patterns", Japanese Journal of Applied Physics, vol. 30, No. 11B, pp. 3010-3015, Nov. 1991.

Watanabe, H., et al., "Detection and Printability of Shifter Defects in Phase-Shifting Masks", Japanese Journal of Applied Physics, vol. 30, No. 11B, pp. 3016-3020, Nov. 1991.

Watanabe, H., et al., "Pattern Transfer Characteristics of Transparent Phase Shifting Mask", Japanese Journal of Applied Physics, vol. 30, No. 11B, pp. 3004-3009, Nov. 1991.

Jinbo, H., et al., "Application of Blind Method to Phase-Shifting Lithography", IEEE, 1992 Symposium On VLSI Technology Digest Of Technical Papers, pp. 112-113 (1992).

Watanabe, H., et al., "Detection and Printability of Shifter Defects in Phase-Shifting Masks II Defocus Characteristics", Jpn. J. Appl. Phys., vol. 31, pp. 4155-4160 (1992).

Pierrat, C., et al., "Phase-Shifting Mask Topography Effects on Lithographic Image Quality", IEEE, pp. 3.3.1-3.3.4 (1992).

Burggraaf, P., "Lithography's Leading Edge, Part I: Phase-Shift Technology and Part 2: 1-Line and Beyond", Semiconductor International, pp. 43-47 and 52-56, Feb. 1992.

IBM, "Phase-Shift Mask Utilizing Silicon Oxy-Nitride as a Low Reflectivity Phase-Shift Layer", IBM Technical Disclosure Bulletin, vol. 34, No. 10B, pp. 360-361, Mar. 1992.

Brunner, T., et al., "170nm Gates Fabricated by Phase-Shift Mask and Top Anti-Reflector Process", SPIE, Optical/Laser Microlithography VI, Vo. 1927, pp. 182-189 (1993).

Lin, B.J., "Phase-Shifting Masks Gain an Edge", IEEE Circuits & Devices, pp. 28-35, Mar. 1993.

Moniwa, A., et al., "Algorithm for Phase-Shift Mask Design with Priority on Shifter Placement", Jpn. J. Appl. Phys., vol. 32, Pt. 1, No. 12B, pp. 5874-5879, Dec. 1193.

Ooi, K., et al., "Computer Aided Design Software for Designing Phase-Shifting Masks", Jpn. J. Appl. Phys., vol. 32, Pt. 1, No. 12B, pp. 5887-5891, Dec. 1993.

Ohtsuka, H., et al., "Evaluation of Repair Phase and Size Tolerance for a Phase-Shift Mask", J. Vac. Sci. Technol. B, vol. 11, No. 6, pp. 2665-2668, Nov./Dec. 1993.

Ronse, K., et al., "Comparison of Various Phase Shift Strategies and Application to 0.35um ASIC Designs", SPIE—Optical/Laser Microlithography VI, vol. 1927, pp. 2-16 (1993).

Galan, G., et al., "Application of Alternating-Type Phase Shift Mask to Polysilicon Level for Random Logic Circuits", Jpn. J. Appl. Phys., vol. 33, pp. 6779-6784 (1994).

Mizuno, F., et al., "Practical Phase-Shifting Mask Technology for 0.3um Large Scale Integrations", J. Vac. Sci. Technol. B, vol. 12, No. 6, pp. 3799-3803, Nov./Dec. 1994.

Pati, Y.C., et al., "Phase-Shifting Masks for Microlithography: Automated Design and Mask Requirements", J. Opt. Soc. Am., vol. 11, No. 9, pp. 2438-2452, Sep. 1994.

Stirniman, J., et al., "Wafer Proximity Correction and Its Impact on Mask-Making", Bacus News, vol. 10, Issue 1, pp. 1, 3-7, 10-12, Jan. 1994.

Waas, T., et al., "Automatic Generation of Phase Shift Mask Layouts", Microelectronic Engineering, vol. 23, pp. 139-142 (1994).

Barouch, E., et al., "Optimask: An OPC Algorithm for Chrome and Phase-Shift Mask Design", SPIE, Vo. 2440, pp. 192-206, Feb. 1995.

Moniwa, A., et al.. "Heuristic Method for Phase-Conflict Minimization in Automatic Phase-Shift Mask Design", Jpn. J. Appl. Phys., vol. 34, Pt. 1, No. 12B, pp. 6584-6589, Dec. 1995.

Langston, J., et al., "Extending Optical Lithography to 0.25um and Below", Solid State Technology, pp. 57-64, Mar. 1995.

Nagahiro, Y., "Improved Mask Technique for Photolithography Applied to 0.25um LSI—Improvement of Resolution, Pattern Correction, Exposure Area", Nikkei Microdevices, pp. 1-6, Apr. 1995.

Okamoto, Y., et al., "A New Phase Shifting Mask Technology for Quarter Micron Photolithography", SPIE, vol. 2512, pp. 311-318 (1995).

Pierrat, C., et al., "Required Optical Characteristics of Materials for Phase-Shifting Masks", Applied Optics, vol. 34, No. 22, pp. 4923-4928, Aug. 1, 1995.

Galan, G., et al., "Alternating Phase Shift Generation for Coplex Circuit Designs", SPIE, vol. 2884, pp. 508-519, Sep. 18-20, 1996.

Kanai, H., et al., "Sub-Quarter Micron Lithography with the Dual-Trench Type Alternating PSM", SPIE, vol. 2793, pp. 165-173 (1996).

Ishiwata, N., et al., "Novel Alternating Phase Shift Mask with Improved Phase Accuracy", SPIE, Proceedings Of The 17th Annual Symposium On Photomask Technology And Management, vol. 3236, pp. 243-249 (1997).

Morimoto, H., et al., "Next Generation Mask Strategy—Technologies are Ready for Mass Production of 256MDRAM?", SPIE, vol. 3236, pp. 188-189 (1997).

Roman, B., et al., "Implications of Device Processing on Photomask CD Requirements", SPIE, vol. 3236 (1997) (Abstract Only).

Nakae, A., et al., "A Proprosal for Pattern Layout Rule in Application of Alternating Phase Shift Mask", SPIE, vol. 3096, pp. 362-374 (1997).

Tsujimoto, E., et al., "Hierarchical Mask Data Design System (Prophet) for Aerial Image Simulation, Automatic Phase-Shifter Placement, and Subpeak Overlap Checking", SPIE, vol. 3096, pp. 163-172 (1997).

Yamamoto, K., et al., "Hierarchical Processing of Levenson-Type Phase Shifter Generation", Jpn. J. Appl. Phys., vol. 36, Part 1, No. 12B, pp. 7499-7503, Dec. 1997.

Gordon, R., et al., "Design and Analysis of Manufacturable Alternating Phase-Shifting Masks", Bacus News, vol. 14, Issue 12, pp. 1-9, Dec. 1998.

Nara, M., et al., "Phase Controllability Improvement for Alternating Phase Shift Mask", Dai Nippon Printing Co., Ltd. (16 pages).

Ohnuma, H., et al., "Lithography Computer Aided Design Technology for Embedded Memory in Logic", Jpn. J. Appl. Phys., vol. 37, Part 1, No. 12B, pp. 6686-6688, Dec. 1998.

Fukuda, H., "Node-Connection/Quantum Phase-Shifting Mask: Path to Below 0.3um Pitch, Proximity Effect Free, Random Interconnects and Memory Patterning", J. Vac. Sci. Technol. B, vol. 17, No. 6, pp. 3291-3295, Nov./Dec. 1999.

Spence, C., et al., "Integration of Optical Proximity Correction Strategies in Strong Phase Shifters Design for Poly-Gate Layers", Bacus News, vol. 15, Issue 12, pp. 1, 4-13, Dec. 1999.

Kuo, C., et al., "Extension of Deep-Ultraviolet Lithography for Patterning Logic Gates Using Alternating Phase Shifting Masks", J. Vac. Sci. Technol. B, vol. 17, No. 6, pp. 3296-3300, Nov./Dec. 1999.

Palmer, S., et al., "Dual Mask Model-Based Proximity Correction for High Perfomance 0.10um CMOS Process", The 44th Int'l Conference on Electron, Ion & Photon Beam Tech. and Nanofabrication Abstracts, pp. 18-19, May 30-Jun. 2, 2000.

Pierrat, C., "Investigation of Proximity Effects in Alternating Aperture Phase Shifting Masks", Numerical Technologies, Inc. (11 pages).

Kikuchi, K., et al., "Method of Expanding Process Window for the Double Exposure Technique with alt-PSMs", Optical Microlithography XIII, Proceeding of SPIE, vol. 4000, pp. 121-131 (2000).

Cooke, M., "OPC/PSM Designs For Poly Gate Layers", European Semiconductor, vol. 22, No. 7, pp. 57-59, Jul. 2000.

Granik, Y., et al., "Sub-Resolution Process Windows And Yield Estimation Technique Based On Detailed Full-Chip CD Simulation", SPIE, vol. 4182, pp. 335-341 (2000).

Plat, M., et al., "The Impact of Optical Enhancement Techniques on the Mask Error Enhancement Funchtion (MEEF)", SPIE, vol. 4000, pp. 206-214, Mar. 1-3, 2000.

Mansuripur, M., et al., "Projection Photolithography", Optics & Photonics News 11, 17 pages, Feb. 2000.

Cote, M., et al., "A Practical Application of Full-Feature Alternating Phase-Shifting Technology for a Phase-Aware Standard-Cell Design Flow", Numerical Technologies Inc. (6 pages).

Heng, F., et al., "Application of Automated Design Migration to Alternating Phase Sifht Mask Design", IBM Research Report RC 21978 (98769), Feb. 26, 2001 (7 pages).

Wong, A., et al., "Alternating Phase-Shifting Mask with Reduced Aberration Sensitivity: Lithography Considerations", Proc. SPIE, vol. 4346, pp. 1-9 (2001).

Liebmann, L.W., et al., "TCAD Development For Lithography Resolution Enhancement", IBM J. Res. & Dev., vol. 45, No. 5, pp. 651-665, Sep. 5, 2001.

\* cited by examiner

FULL PHASE SHIFTING MASK IN DAMASCENE PROCESS

RELATED APPLICATIONS

This application is a continuation of U.S. patent application Ser. No. 11/035,788 entitled "Full Phase Shifting Mask In Damascene Process" filed Jan. 13, 2005 which is a continuation of U.S. patent application Ser. No. 10/295,575 entitled "Full Phase Shifting Mask In Damascene Process" filed Nov. 14, 2002, which is related to and claims the benefit of priority of the provisional application 60/363,674 filed 11 Mar. 2002, entitled "Full Phase Mask in Damascene Process", having inventor Christophe Pierrat, and assigned to the assignee of the present application.

This application is related to and claims the benefit of priority of the non-provisional application Ser. No. 09/669,368 filed 26 Sep. 2000, entitled "Phase Shift Masking for Intersecting Lines/", having inventor Christophe Pierrat, and assigned to the assignee of the present application.

This application is related to and claims the benefit of priority of the non-provisional application Ser. No. 09/932,239 filed 17 Aug. 2001, entitled "Phase Conflict Resolution for Photolithographic Masks", having inventors Christophe Pierrat, et. al., and assigned to the assignee of the present application.

BACKGROUND OF THE INVENTION

1. Field of the Invention

A full phase shifting mask for patterning a metal layer in an integrated circuit is described. In particular, the full phase shifting mask can be used with a damascene process, thereby allowing hard-to-etch materials, such as copper, to be used for the metal layer.

2. Description of the Related Art

A standard binary mask includes a patterned opaque (e.g. chrome) layer formed on a transparent (e.g. quartz) substrate. The pattern can be transferred onto the wafer using optical lithography. Specifically, for each layer of the circuit design, a radiation (e.g. light) source is shone on the mask (wherein the term mask can also refer herein to a reticle) corresponding to that layer. This radiation passes through the transparent regions of the mask and is blocked by the opaque regions of the mask, thereby selectively exposing a photoresist layer on the wafer.

The areas in the photoresist layer exposed to the radiation, i.e. irradiated areas, are either soluble or insoluble in a specific solvent, called a developer. If the irradiated areas are soluble, then the photoresist is called a positive photoresist. In contrast, if the irradiated areas are insoluble, then the photoresist is called a negative photoresist. After development of the photoresist layer, the underlying semiconductor layer no longer covered by photoresist can be removed by an anisotropic etch, thereby transferring the desired pattern onto the wafer. This process can be repeated for each layer of the integrated circuit design on the wafer.

A conventional process for patterning a metal layer comprises depositing that metal layer on the wafer and then depositing a positive photoresist layer on the metal layer. The positive photoresist can then be exposed using a clear field binary mask (wherein the opaque pattern on the mask represents features in the layout). At this point, etching can be performed to generate the desired pattern in the metal layer.

This process works well for metal patterns having critical dimensions greater than 0.13 microns. However, to enhance device performance at smaller critical dimensions, the semiconductor industry is moving from aluminum to copper. Unfortunately, copper is very difficult to etch. Therefore, a conventional metal process as described above cannot be used for a copper layer.

However, a damascene process can be used to form a copper pattern. The damascene process can include forming an oxide layer on the wafer and then depositing a negative photoresist layer on the oxide layer. The negative photoresist can be exposed using the clear field binary mask. After exposure, the exposed portions of the oxide layer can be easily etched to form the desired pattern. At this point, copper can be deposited and planarized (e.g. using a CMP operation), thereby forming the desired pattern in copper.

However, positive photoresists are currently the dominant resists for many applications as they provide better resolution than negative photoresists. Therefore, a need arises for a technique of patterning a metal layer, particularly a hard-to-etch metal, using a positive photoresist.

SUMMARY OF THE INVENTION

In accordance with one aspect of the invention, a type of phase shifting mask (PSM) can be advantageously used in a damascene process. The damascene process can include the development of a positive photoresist, thereby ensuring optimal resolution of the metal pattern. Of importance, the inherent qualities of a PSM and a positive photoresist facilitate the conversion of an original layout to a PSM layout.

In one embodiment, a mask set for patterning a metal layer in an integrated circuit is provided. The mask set can include a full phase shifting mask (FPSM) and a dark field trim mask. The FPSM includes a plurality of shifters, wherein the shifters define most features in the metal layer. The dark field trim mask can include at least a first cut. This first cut corresponds to a second cut on the FPSM, wherein the second cut resolves a phase conflict on the FPSM. In one case, exposing two proximate shifters on the FPSM and the first cut on the trim mask can form a feature in the metal layer.

The FPSM can further include one or more assist shifters, sometimes also called assist bars or scattering bars. Assist shifters, which are very small and therefore do not print, nonetheless aid in printing resolution. Assist shifters can be placed on either side of isolated shifters, placed alongside isolated edges of one or more sets of densely packed shifters, and/or interspersed with a plurality of intermediate spaced shifters. In one embodiment, the FPSM and/or the trim mask can include other proximity corrections. These proximity corrections could be provided by either rule-based optical proximity correction (OPC) or model-based OPC. Although the term optical proximity correction is used herein it is used generically to refer to any type of proximity correction, e.g. resist, etch, micro-loading, etc.

An exemplary technique of making a phase shifting mask (PSM) is also provided. In this technique, a layout for defining a plurality of features in a metal layer can be received. This layout can be converted, if necessary, so that most of the features in the layout are represented by shifters in the PSM (called an FPSM herein). In one embodiment, both critical and non-critical features can be represented by shifters in a one-to-one correspondence. If a phase conflict occurs in the converted layout, then a feature associated with the phase conflict can be cut, thereby creating two shifters. At this point, one of the two shifters can be changed to a different phase. The converted layout can then be transferred to the FPSM using a known mask writing process. The FPSM can be used for patterning a metal layer, such as copper, in a damascene process.

An exemplary technique for patterning the metal layer is also provided. In this technique, an oxide layer can be deposited on a wafer. Then, a positive photoresist layer can be deposited on the oxide layer. At this point, the positive photoresist layer can be exposed with a full phase shifting mask (FPSM) and a trim mask. The FPSM includes a plurality of shifters, wherein the shifters represent most features in the metal layer. In one embodiment, the trim mask is a dark field trim mask with at least one cut. This cut corresponds to a cut on the FPSM, wherein the cut on the FPSM resolved a phase conflict on the FPSM. At this point, the positive photoresist layer can be developed and the exposed portions of the oxide layer can be etched, thereby transferring the desired pattern to the oxide layer. Then, the metal layer can be deposited on the wafer and planarized to substantially a top surface of the etched oxide layer. In this manner, the desired pattern has been transferred to the metal layer without etching of the metal. This damascene process is particularly useful for hard-to-etch metals, such as copper.

BRIEF DESCRIPTION OF THE FIGURES

The patent or application file contains at least one drawing executed in color. Copies of this patent or patent application publication with color drawing(s) will be provided by the Patent and Trademark Office upon request and payment of the necessary fee.

DETAILED DESCRIPTION OF THE FIGURES

Overview of Phase Shifting for Non-Damascene Layers

In accordance with one aspect of the invention, a type of phase shifting mask (PSM) can be advantageously used in a damascene process with positive photoresist. In a PSM, complementary phase shifters (also called shifters) are configured such that the exposure radiation transmitted by one shifter is approximately 180 degrees out of phase with the exposure radiation transmitted by the other shifter. Therefore, rather than constructively interfering and merging into a single image, the projected images destructively interfere where their edges overlap, thereby creating a clear and very small low intensity image between the pair of shifters. This low intensity image generally represents a feature on the layout.

For example, in one embodiment, the shifters can be used to print critical features of a layout. These critical features can be user-defined and could include the gates of transistors. In a standard process, this PSM can be used in conjunction with a clear field trim mask that defines other features of the layout.

Overview of Phase Shifting for Damascene Layers

In accordance with one feature of the invention, instead of defining a feature by the low intensity area between the shifters, the high intensity areas created by the shifters can define the features. Thus, the inherent qualities of a PSM and a positive photoresist facilitate the conversion of an original layout to a PSM layout that can be used in a damascene process. Specifically, an original layout can be easily converted to a PSM layout by replacing features with shifters.

Figure 1A:
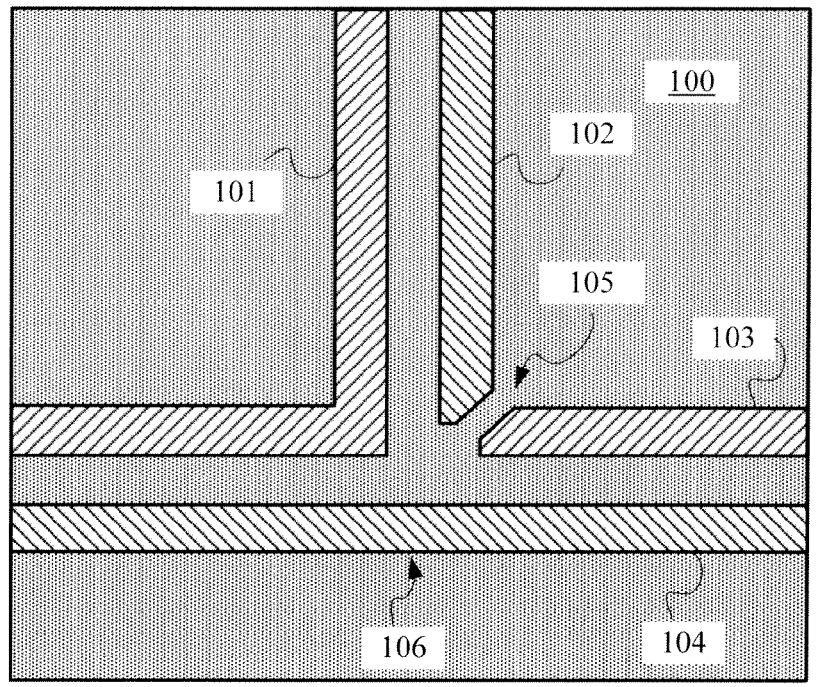
FIG. 1A illustrates a full phase shifting mask (FPSM) layout for forming three lines in a metal layer.

In one embodiment, the phase shifters can be formed on a full phase shifting mask (FPSM), which can define substantially all of the desired features of a layout for the metal layer. This FPSM can be used in conjunction with a dark field trim mask that can further define the areas of features left unexposed by the FPSM (explained below). For example, FIG. 1A illustrates a FPSM layout 100 that can be used in a damascene process for forming features in a metal layer. FPSM layout 100 includes shifters 101, 102, 103, and 104, wherein shifters 101 and 103 could provide 0 degree phase, whereas shifters 102 and 104 could provide 180 degree phase. The desired three line pattern is shown best in FIG. 1B by the dashed lines.

Note that the phase assignments discussed herein are illustrative only. Thus, shifters 101 and 103 could be 180 degree shifters, whereas shifters 102 and 104 could be 0 degree shifters. Moreover, shifters 101 and 103 could be 185 degree shifters, and shifters 102 and 104 could be 5 degree shifters. The important aspect is that adjacent shifters have a phase difference of approximately 180 degrees.

To conform to this requirement, a cut 105 can be provided, thereby resolving a potential phase conflict when assigning phase to the shifters of FPSM layout 100. Note that cut 105 results in an unexposed region between phase shifter 102 and phase shifter 103. However, a trim layout 110, shown in FIG. 1B, can expose this remainder of the feature, i.e. by exposing the photoresist in that area. Specifically, trim layout 110 can include a cut 111 (which is substantially the size of cut 105) to account for the adjacency of shifters 101 and 102 as well as the adjacency of shifters 103 and 104. Note that trim layout 110, which includes the target layout (shown in dashed lines) for context, would actually include only cut 111 (shown in white). In one embodiment, the relationship between the width of the shifters and that of the printed lines can be 1-1. In other words, a 100 nm wide shifter can roughly define a 100 nm wide metal line. Note that proximity effects can affect this width. Therefore, appropriate correction to the shifter can be used to more closely approximate the desired line width.

Figure 1B:
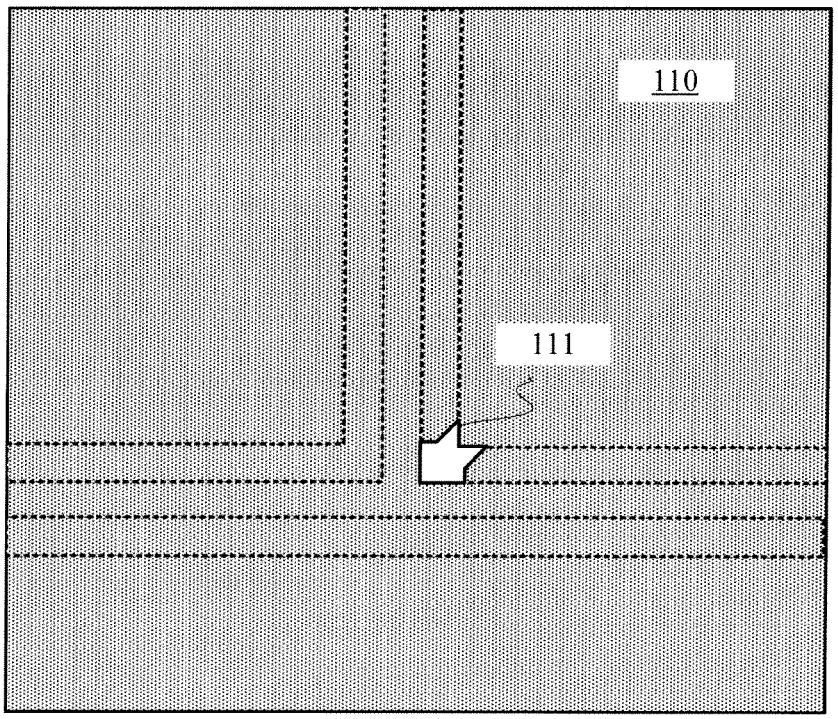
FIG. 1B illustrates a trim layout that corresponds to the FPSM layout of FIG. 1A. Specifically, the trim layout can eliminate extraneous features created by the FPSM layout.
Figure 1C:
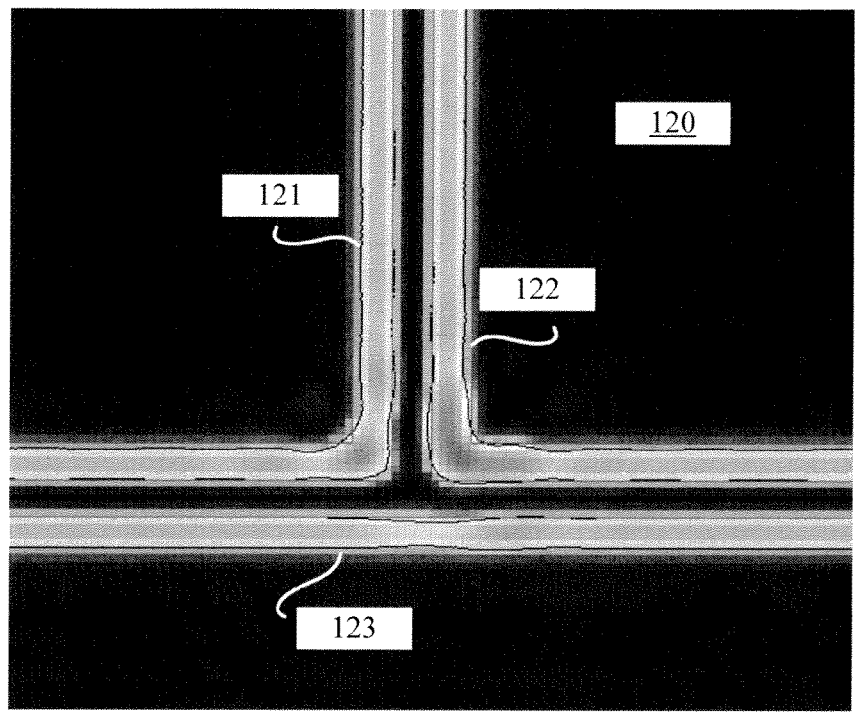
FIG. 1C illustrates an aerial image after exposing two masks implementing the FPSM layout of FIG. 1A and the trim layout of FIG. 1B.

FIG. 1C illustrates an aerial image 120 that could be formed by exposing a mask implementing FPSM layout 100 as well as a mask implementing trim layout 110. In this case, the trim mask was exposed to twice the energy of the FPSM (referenced as a 1:2 exposure ratio). In other words, if the FPSM was exposed to N mJ/cm$^2$, then the trim mask was exposed to 2N mJ/cm$^2$. The exposure conditions for aerial image 120 were a wavelength ($\lambda$) of 193 nm, a partial coherence ($\sigma$) of 0.4, and a numerical aperture (NA) of 0.85.

The blue portion of aerial image 120 indicates a low intensity, the red portion indicates a high intensity, the yellow portion indicates an intermediate intensity, etc. The high intensity correlates to a high exposure, whereas the low intensity correlates to a low exposure. As evidenced by the yellow and red bands in aerial image 120, the transition from high to low intensity is abrupt, thereby resulting in well-defined features. Specifically, aerial image 120 illustrates the formation of three lines 121, 122, and 123 (which correspond to the target layout shown as dashed lines in FIG. 1B). The predicted printed edge is shown as a black line in the aerial image.

In accordance with one aspect of the invention, lines 121, 122, and 123 could represent exposed areas of an oxide layer following development of a positive photoresist layer. After etching these exposed areas, a copper layer could be deposited and planarized using the above-described damascene process, thereby forming three copper lines on the wafer. Advantageously, because the damascene process can include the development of a positive photoresist, the printing resolution of the metal pattern can be optimized.

Note that the cut and phase assignment described in reference to FIG. 1A can be used on any region that includes a bend and tends to print large. In other words, the cut and phase assignment can be used on many corners of a FPSM layout.

To further improve lithographic performance, various modifications can be made to a layout to compensate for various proximity effects. These modifications are called proximity corrections. One type of proximity correction, called optical proximity correction (OPC), applies systematic changes to geometries of the layout to improve the printability of a wafer pattern in response to a variety of proximity effects, e.g. etch, resist, micro-loading, other proximity effects, and/or combinations of proximity effects.

Rule-based OPC can include rules to implement certain changes to the layout, thereby compensating for some lithographic distortions that occur when printing the features onto the wafer. For example, to compensate for line-end shortening, rule-based OPC can add a hammerhead to a line end. Additionally, to compensate for corner rounding, rule-based OPC can add (or subtract) serif shapes from outer (or inner) corners. These changes can form features on the wafer that are closer to the original intended layout.

In model-based OPC, a real pattern transfer can be simulated (i.e. predicted) with a set of mathematical formulas (i.e. models). In model-based OPC, the edges of a feature in a layout can be dissected into a plurality of segments, thereby allowing these segments to be individually moved to correct for proximity effects. The placement of the dissection points is determined by the feature shape, size, and/or position relative to other features.

Figure 2C:
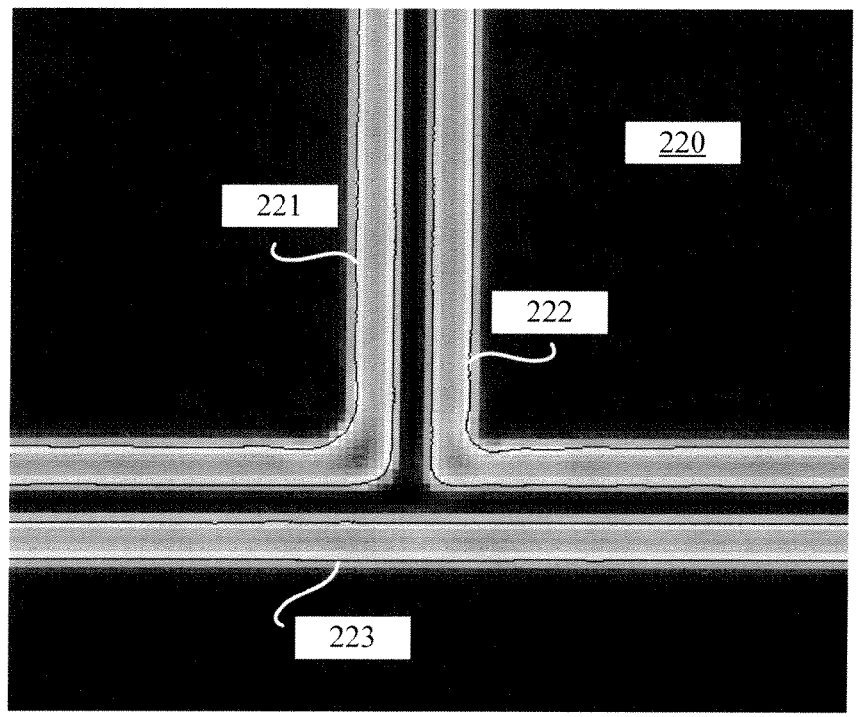
FIG. 2C illustrates a printed image after exposing masks implementing the FPSM layout of FIG. 2A and the trim layout of FIG. 2B.
Figure 2A:
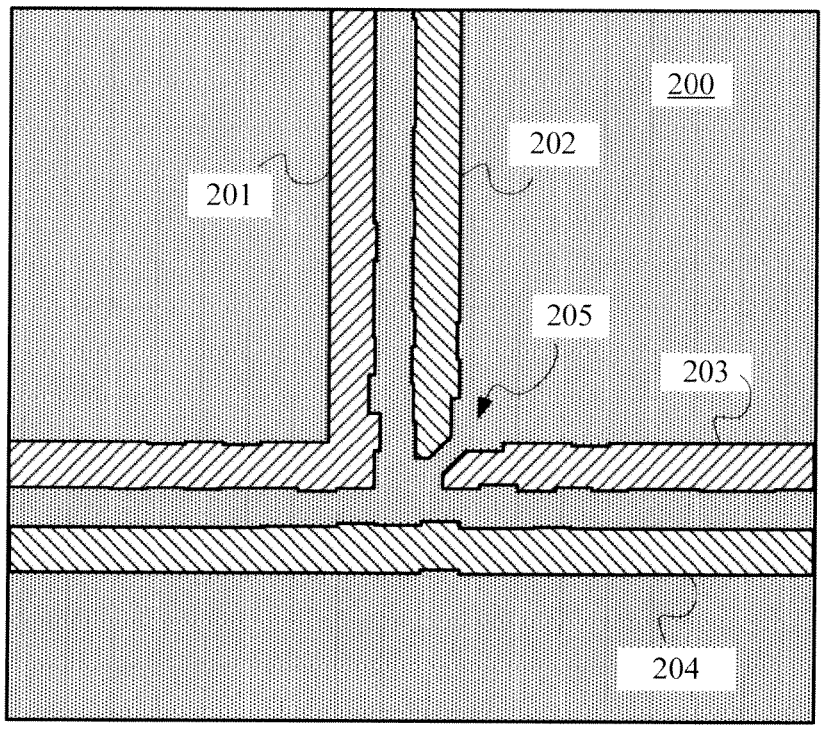
FIG. 2A illustrates a FPSM layout including proximity corrections, wherein the modified FPSM layout can form three lines in a metal layer.

FIG. 2A illustrates an FPSM layout 200, similar to FPSM layout 100 but including several proximity corrections, which can be used in a damascene process. FPSM layout 100 includes shifters 201, 202, 203, and 204, wherein shifters 201 and 203 could provide 0 degree phase, whereas shifters 202 and 204 could provide 180 degree phase. Once again, shifters 201-204 are formed in a dark field mask.

Figure 2B:
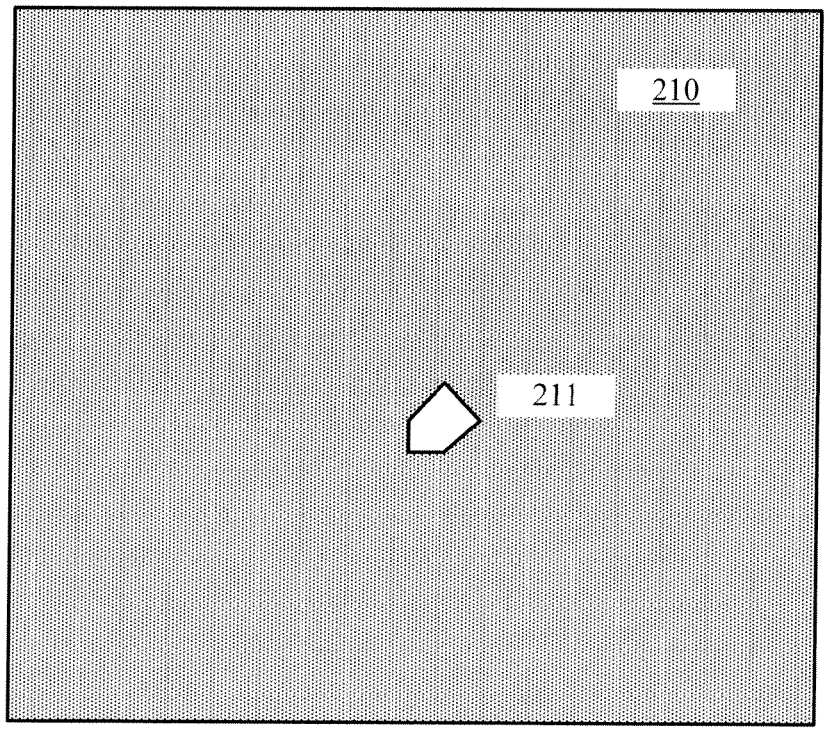
FIG. 2B illustrates a trim layout that corresponds to the FPSM layout of FIG. 2A.

To conform to a configuration in which adjacent shifters have a phase difference of approximately 180 degrees, a cut 205 can be provided, thereby resolving a potential phase conflict when assigning phase to the shifters of FPSM layout 200. To expose the extraneous feature created by cut 205, a trim layout 210 can be provided, as shown in FIG. 2B. Trim layout 210 includes a cut 211, which is substantially the size of cut 205, to account for the adjacency of shifters 201 and 202, shifters 201 and 204, as well as shifters 203 and 204. Note that cut 211 can include proximity corrections including edge modifications as well as one or more cuts therein.

In one embodiment, additional cuts on trim mask 210 can be used to provide critical dimension (CD) control. U.S. Provisional Patent Application 60/359,909, entitled "Non-Critical Blocking for Full Phase Masks", filed on Feb. 26, 2002 by Numerical Technologies, Inc., and incorporated by reference herein, describes such additional cuts.

FIG. 2C illustrates an aerial image 220 that could be formed by exposing a mask implementing FPSM layout 200 as well as a mask implementing trim layout 210. Once again, the trim mask was exposed to twice the energy of the FPSM (referenced as a 1:2 exposure ratio). To permit comparisons, the exposure conditions for aerial image 220 are identical to those used for aerial image 120, e.g. wavelength ($\lambda$) of 193 nm, a partial coherence ($\sigma$) of 0.4, and a numerical aperture (NA) of 0.85. Standard OPC parameters, which refer to the segment lengths after dissection, can be used for aerial image 220. In one embodiment, the OPC parameters can include 20 nm for the FPSM mask and 40 nm for the trim mask.

As evidenced by the substantially red bands in aerial image 220, the transition from intermediate to low intensity is even more abrupt than in aerial image 120, thereby resulting in three extremely well defined features 221, 222, and 223. Thus, compared to the non-OPC result (i.e. aerial image 120), the resulting OPC image (i.e. aerial image 220) improves straightness of the edges of the three lines as well as intensity. In one embodiment, both aerial images 120 and 220 illustrate 100 nm features. The predicted printed edge is shown as a black line in the aerial image. FIGS. 1C and 2C are shown on the same page to illustrate the improvements provided by OPC.

Figure 3A:
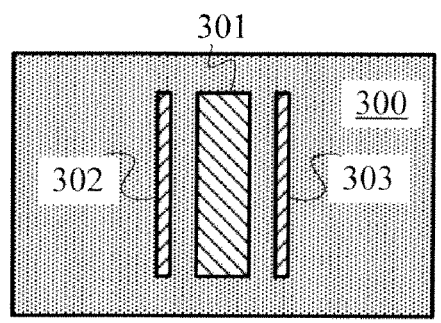
FIG. 3A illustrates a FPSM layout including an isolated shifter and two assist shifters placed on either side of the isolated shifter.

In accordance with one embodiment of the invention, assist shifters (which because of their small size do not print, but nonetheless aid in printing resolution) can be used to define isolated, and semi-isolated metal lines. In the case of densely packed metal lines, the phase of each metal line can be alternated to provide better feature definition and the semi-isolated metal lines on the end can receive assist shifters as well. Specifically, assist shifters could be used to improve the printing of an isolated metal line. For example, FIG. 3A illustrates a FPSM layout 300 including an isolated metal line that will be defined using a phase shifter 301. By adding assist shifters 302 and 303, placed on either side of and out of phase with shifter 301, the isolated metal line can be defined more easily.

Figure 3B:
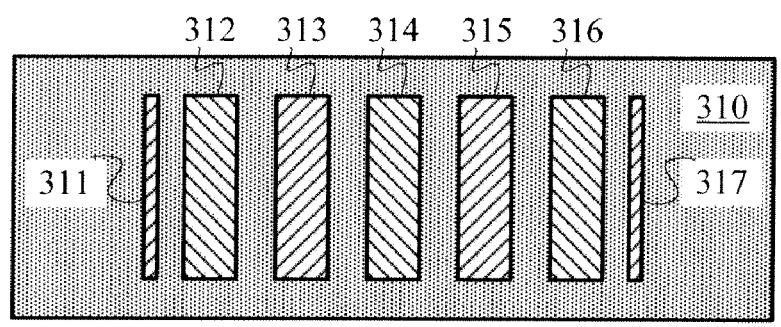
FIG. 3B illustrates a FPSM layout including multiple densely spaced shifters with assist shifters placed at their periphery.

FIG. 3B illustrates a FPSM layout 310 including multiple densely packed metal lines that will be defined using shifters 312-316 (wherein adjacent shifters have opposite phase). In the case of semi-isolated features on the ends of the row, e.g. shifters 312 and 316 that have no printable, proximate features, assist shifters can be used. Therefore, in this example, shifters 312 and 316 can have assist shifters 311 and 317, respectively, placed alongside their isolated edges to improve their printing. The assist shifters are out of phase with the phase of the features themselves.

Figure 3C:
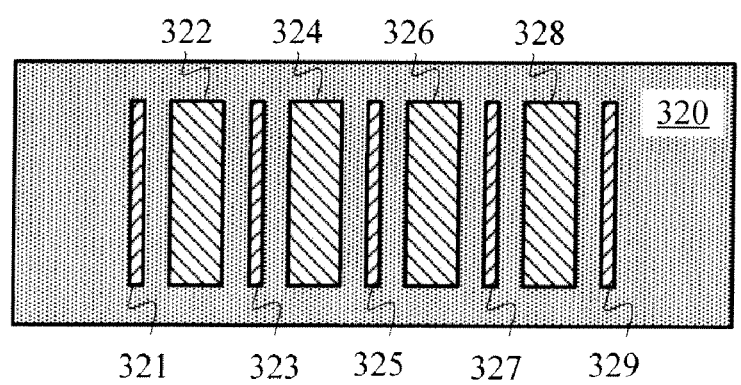
FIG. 3C illustrates a FPSM layout includes intermediate spaced (i.e. between isolated and densely spaced) shifters with interspersed assist shifters.

FIG. 3C illustrates a FPSM layout 320 including intermediate spaced or semi-isolated (i.e. between isolated and densely packed) metal lines that will be defined by shifters 322, 324, 326, and 328 with interspersed assist shifters 321, 323, 325, 327, and 329. Once again, the phase of adjacent shifters/assist shifters have opposite phase. Note that the configuration of the shifters including assist shifters (e.g. FIGS. 3A-3C) and determining phase assignment of those shifters can be a function of pitch in the layout as well as an exposure setting.

Figure 3D:
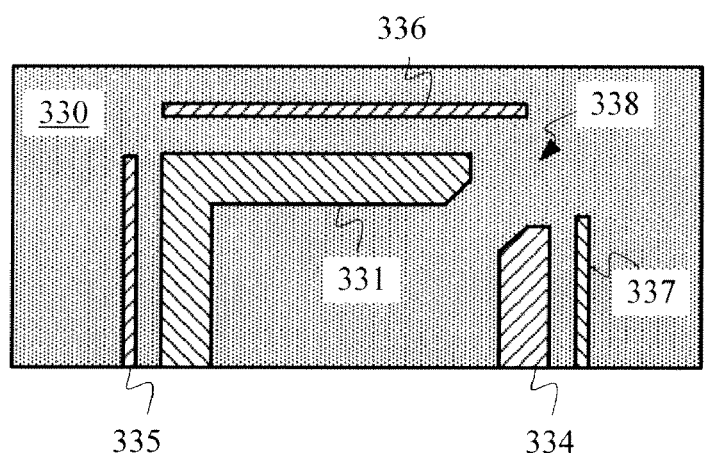
FIG. 3D illustrates a FPSM layout including shifters and assist shifters in an exemplary configuration.

FIG. 3D illustrates an FPSM layout 330 including shifters 331 and 334 for printing metal lines in a U-shape configuration. As shown, all but one corner (cut 338) of the U will be defined on the phase shifting layer (with that corner defined by an opening, or cut, on the trim layout (not shown)). To improve printing of the features corresponding to those shifters, assist shifters 335, 336, and 337 can be added to FPSM layout 330. In one embodiment, although shifters 331 and 334 actually define the same feature, a cut 338 is placed to resolve a potential phase conflict between the U-shaped metal line and other features (not shown). In this case, an associated dark field trim mask (not shown) could include an appropriate cut to expose the area corresponding to cut 338, c.f. FIG. 1B.

Figure 3E:
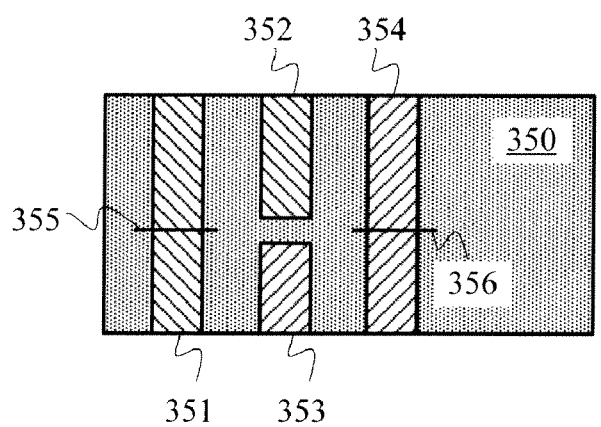
FIG. 3E illustrates a FPSM layout in which multiple shifters in a common area can be cut to resolve a phase conflict.

FIG. 3E illustrates a FPSM layout 350 including shifters 351, 352, 353, and 354, wherein all shifters correspond to individual features, e.g. two metal lines along side two shorter metal lines. Because of phase assignments made in other part of the layout (not shown), phase conflicts are created between shifters 351 and 352 as well as between shifters 353 and 354. In one embodiment, these shifters can be cut in the areas designated by cut-lines 355 and 356. In that case, the upper portion of shifter 351 can be switched to a phase opposite that the lower portion. In a similar manner, the lower portion of shifter 354 can be switched to a phase opposite that the upper portion. In this case, an associated dark field trim mask could expose the areas where the cuts were made in shifters 351 and 354.

Figure 4:
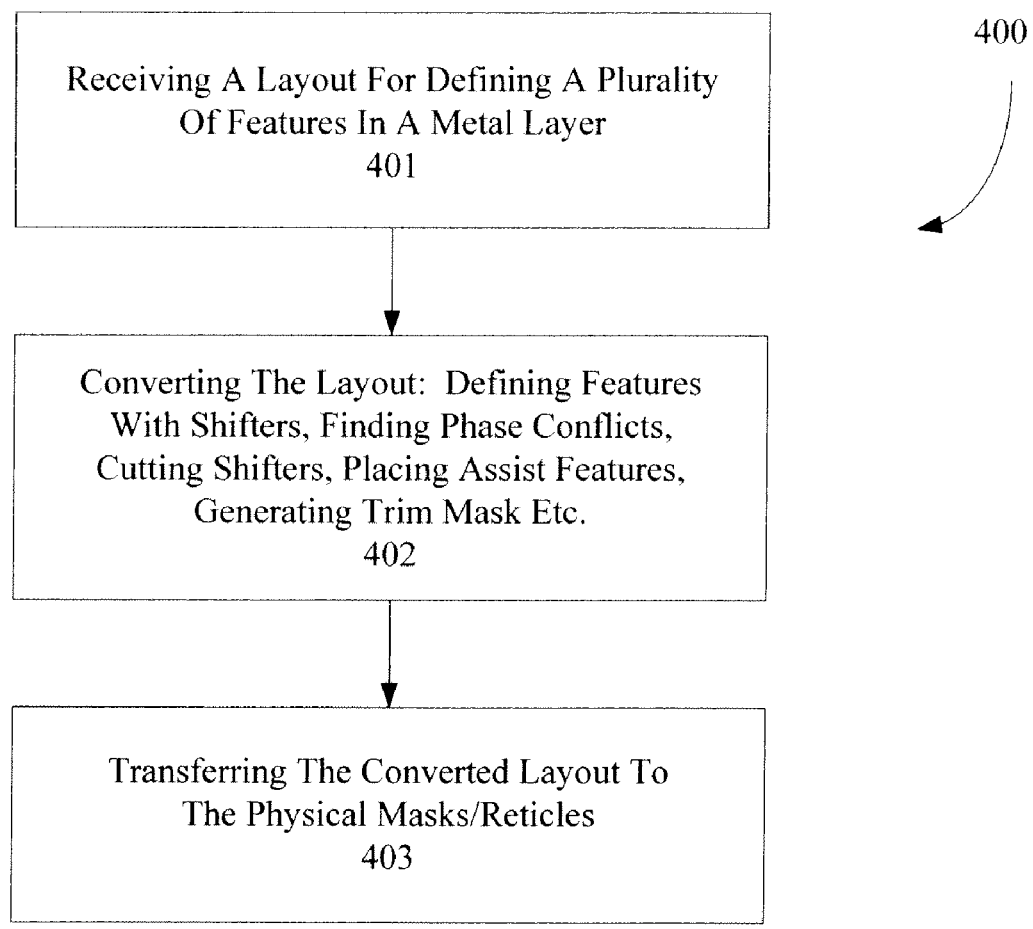
FIG. 4 illustrates an exemplary technique of making an FPSM.

FIG. 4 illustrates an exemplary technique 400 of making a FPSM and trim mask. In step 401, a layout for defining a plurality of features in a metal layer can be received (e.g. the target or desired layout). This layout could be included in a GDS II file or other appropriate format. In step 402, the layout can be converted, if necessary, so that substantially all of the features in the layout are defined by shifters in a FPSM layout. In one embodiment, both critical and non-critical features can be represented by shifters in a one-to-one correspondence. This conversion can further include finding phase conflicts, cutting shifters as appropriate to resolve these phase conflicts, placing assist features as needed to improve printing resolution, and generating a trim mask layout based on the FPSM layout. The converted layout (including both the FPSM and trim layouts) can then be transferred to the physical masks (or reticle) using a known mask writing process in step 403. The mask set can be used for patterning a metal layer, such as copper, in a damascene process.

Figure 5:
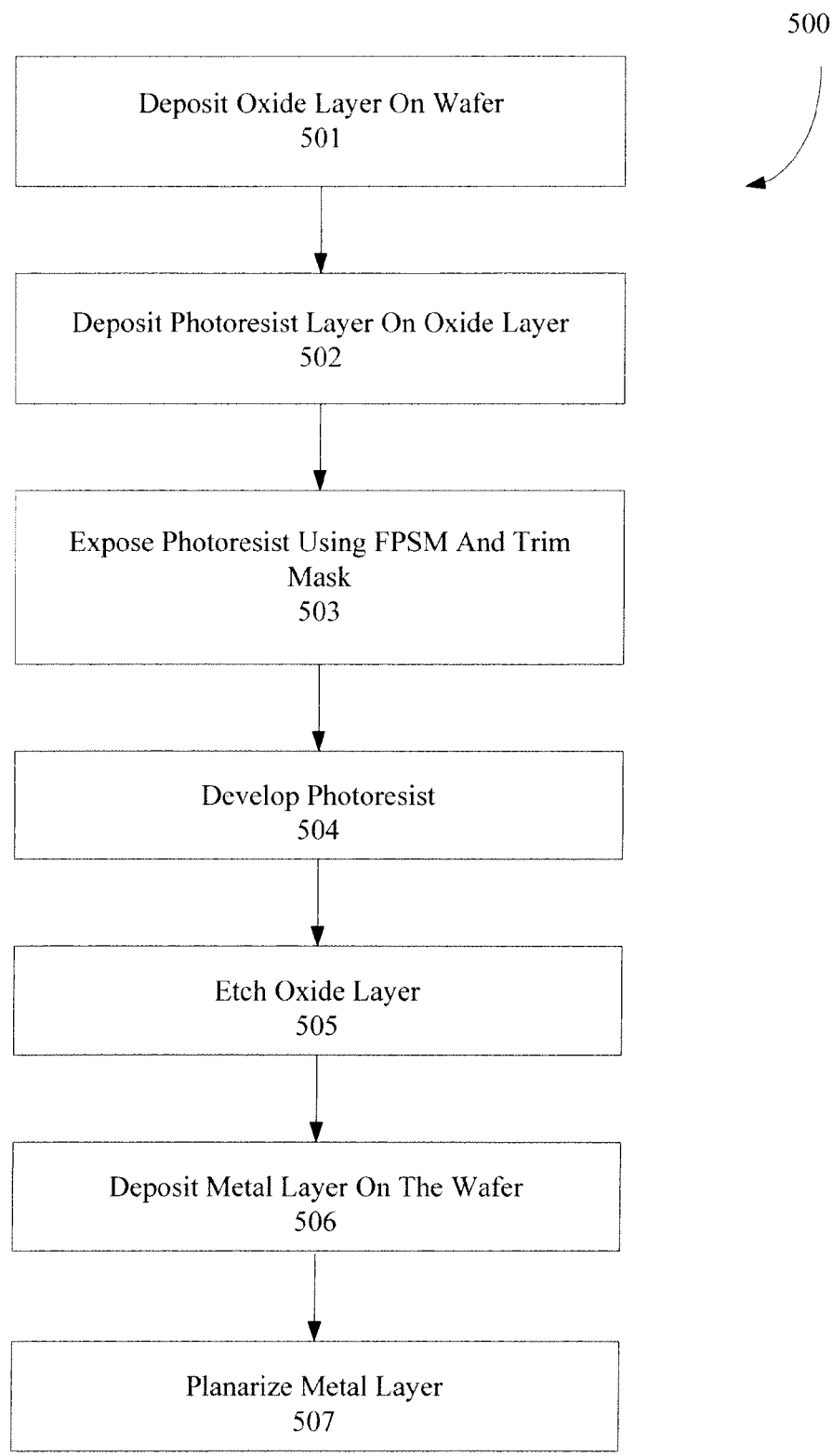
FIG. 5 illustrates an exemplary technique for patterning a metal layer with a FPSM.

FIG. 5 illustrates an exemplary technique 500 for patterning that metal layer. In step 501, an oxide layer can be deposited on a wafer. In step 502, a positive photoresist layer can be deposited on the oxide layer. At this point, the positive photoresist layer can be exposed with a FPSM and a trim mask in step 503. The FPSM includes a plurality of shifters, wherein the shifters represent most features in the metal layer. In one embodiment, the trim mask is a dark field trim mask with at least one cut. This cut corresponds to a cut on the FPSM, wherein the cut on the FPSM resolved a phase conflict on the FPSM. In step 504, the positive photoresist layer can be developed. At this point, the oxide layer can be etched in step 505, thereby transferring the desired pattern to the oxide layer. In step 506, the metal layer can be deposited on the wafer. In step 507, the metal layer can be planarized to substantially a top surface of the etched oxide layer. In this manner, the desired pattern has been transferred to the metal layer without etching of the metal. This damascene process is particularly useful for hard-to-etch metals, such as copper.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent.

For example, instead of cutting a feature at a corner (e.g. FIGS. 1A, 2A, 3D, and 3E), the cut could be made in the line. Thus, referring to FIG. 1A, in lieu of cut 105, a cut could be made in shifter 104 at position 106. The techniques described herein can be applied to mask layouts for various lithographic process technologies, including ultraviolet, deep ultraviolet (DUV), extreme ultraviolet (EUV), x-ray, etc. Accordingly, it is intended that the scope of the invention be defined by the following Claims and their equivalents.

The invention claimed is:

1. A method of generating a mask set, the mask set used for forming a T feature in a metal layer using a damascene process, the T feature including three lines, the method comprising:
designing a phase shifting mask (PSM) to form a first portion of the T feature in the metal layer, wherein designing the PSM includes:
using a first shifter for forming part of a top portion of the T feature;
using a second shifter for forming another part of the top portion of the T feature and a part of a base portion of the T feature;
using a third shifter for forming yet another part of the top portion of the T feature; and
using a fourth shifter for forming another part of the base portion of the T feature; and
designing a dark field trim mask to form a second portion of the T feature in the metal layer, wherein the trim mask includes at least a first cut, the first cut corresponding to a second cut between the third and fourth shifters on the PSM, the second cut resolving a phase conflict on the PSM.

2. The method of claim 1, wherein designing the PSM includes providing proximity corrections for at least one of the first, second, third, and fourth shifters.

3. The method of claim 1, wherein designing the dark field trim mask includes providing proximity corrections for the first cut.

4. A layout for a dark field phase shifting mask (PSM), the dark field PSM used to form a plurality of features on a metal layer, the metal layer forming one layer of an integrated circuit, the layout comprising:
a T feature including three non-intersecting lines, the T feature comprising:
a first shifter for forming part of a top portion of the T feature;
a second shifter for forming another part of the top portion of the T feature and a part of a base portion of the T feature;
a third shifter for forming yet another part of the top portion of the T feature; and
a fourth shifter for forming another part of the base portion of the T feature, wherein a cut between the third and fourth shifters resolves a phase conflict on the dark field PSM.

5. The layout of claim 4, wherein at least one of the first, second, third, and fourth shifters includes proximity corrections.

6. A mask set used for forming a T feature in a metal layer using a damascene process, the T feature including three lines, the mask set comprising:
a phase shifting mask (PSM) to form a first portion of the T feature in the metal layer, the PSM including:
a first shifter for forming part of a top portion of the T feature;
a second shifter for forming another part of the top portion of the T feature and a part of a base portion of the T feature;
a third shifter for forming yet another part of the top portion of the T feature; and
a fourth shifter for forming another part of the base portion of the T feature; and
a dark field trim mask to form a second portion of the T feature in the metal layer, wherein the dark field trim mask includes at least a first cut, the first cut corresponding to a second cut between the third and fourth shifters on the PSM, the second cut resolving a phase conflict on the PSM.

7. The mask set of claim 6, wherein at least one of the first, second, third, and fourth shifters includes proximity corrections.

8. The mask set of claim 6, wherein the first cut includes proximity corrections.

9. A method of forming features in a metal layer using a dark field mask, the method comprising:
for an isolated feature,
providing a shifter having a first phase, the shifter forming a feature; and
positioning assist features on either side of the shifter, the assist features having a second phase, and the assist features being sub-resolution features, and the assist features being sub-resolution features.

10. A dark field mask for forming features in a metal layer, the dark field mask comprising:
a shifter having a first phase, the shifter forming an isolated feature; and
assist features on either side of the shifter, the assist features having a second phase, and the assist features being sub-resolution features, and the assist features being sub-resolution features.

11. A method of forming features in a metal layer using a dark field mask, the method comprising:
for a semi-isolated feature bordering a densely packed feature area,
providing a shifter having a first phase, the shifter forming a feature; and
positioning an assist feature on a first side of the shifter, the second side of the shifter bordering the densely packed feature area, the assist feature having a second phase, and the assist feature being a sub-resolution feature, and the assist features being sub-resolution features.

12. A dark field mask for forming features in a metal layer, the dark field mask comprising:
a shifter having a first phase, the shifter forming a semi-isolated feature bordering a densely packed feature area; and
an assist feature on a first side of the shifter, the second side of the shifter bordering the densely packed feature area, the assist feature having a second phase, and the assist feature being a sub-resolution feature, and the assist features being sub-resolution features.

13. A method of forming features in a metal layer using a dark field mask, the method comprising:
for an intermediate spaced feature area,
providing shifters having a first phase, each of the shifters forming a feature; and
positioning an assist feature between each pair of shifters, the assist feature having a second phase, and the assist feature being a sub-resolution feature, and the assist features being sub-resolution features.

14. The method of claim 13, wherein if a shifter has an isolated side, then further including positioning another assist feature on the isolated side, the other assist feature having the second phase.

15. A dark field mask for forming features in a metal layer, the dark field mask comprising:
shifters having a first phase, each of the shifters forming a feature in an intermediate spaced feature area; and
an assist feature between each pair of shifters, the assist feature having a second phase, and the assist feature being a sub-resolution feature, and the assist features being sub-resolution features.

16. The dark field mask of claim 15, wherein if a shifter has an isolated side, then further including another assist feature on the isolated side, the other assist feature having the second phase.

17. A method of forming a U shape feature in a metal layer using a dark field mask and a dark field trim mask, the method comprising:
for the dark field mask,
providing a corner shifter having a first phase;
providing a first assist feature adjacent one outer edge of the corner shifter, the first assist feature having a second phase;
providing a second assist feature adjacent another outer edge of the corner shifter, the second assist feature having the second phase, wherein the corner shifter, the first assist feature, and the second assist feature form first and second sides of the U shape feature;
providing a line shifter having the second phase;
providing a third assist feature adjacent an edge of the line shifter, the third assist feature having the first phase, wherein the line shifter and the third assist feature form a third side of the U shape feature; and
providing a cut on the dark field trim mask, wherein the cut corresponds to a space between the corner shifter and the line shifter; and
exposing the dark field mask and the dark field trim mask, wherein the each assist feature is a sub-resolution feature, wherein the assist features being sub-resolution features.

18. A mask set for forming features in a metal layer using a dark field mask and a dark field trim mask, the mask set comprising:
for the dark field mask,
a corner shifter having a first phase;
a first assist feature adjacent one outer edge of the corner shifter, the first assist feature having a second phase;
a second assist feature adjacent another outer edge of the corner shifter, the second assist feature having the second phase, wherein the corner shifter, the first assist feature, and the second assist feature form first and second sides of a U shape feature;
a line shifter having the second phase; and
a third assist feature adjacent an edge of the line shifter, the third assist feature having the first phase, wherein the line shifter and the third assist feature form a third side of the U shape feature,
wherein each assist feature is a sub-resolution feature, wherein each assist features is a sub-resolution feature.

19. The mask set of claim 18, further comprising:
for the dark field trim mask,
a cut corresponding to a space between the corner shifter and the line shifter.

* * * * *

UNITED STATES PATENT AND TRADEMARK OFFICE
CERTIFICATE OF CORRECTION

PATENT NO. : 7,659,042 B2
APPLICATION NO. : 12/184215
DATED : February 9, 2010
INVENTOR(S) : Christophe Pierrat It is certified that error appears in the above-identified patent and that said Letters Patent is hereby corrected as shown below:

Column 9, lines 17-18, delete ", and the assist features being sub-resolution features".

Column 9, lines 25-26, delete ", and the assist features being sub-resolution features".

Column 9, lines 37-38, delete ", and the assist features being sub-resolution features".

Column 9, lines 48-49, delete ", and the assist features being sub-resolution features".

Column 9, lines 57-58, delete ", and the assist features being sub-resolution features".

Column 10, lines 7-8, delete ", and the assist features being sub-resolution features".

Column 10, lines 35-37, delete ", wherein the assist features being sub-resolution features".

Column 10, lines 55-57, delete ", wherein each assist features is a sub-resolution feature".

Signed and Sealed this

Sixth Day of April, 2010

David J. Kappos
*Director of the United States Patent and Trademark Office*